United States Patent
Sugiura et al.

(10) Patent No.: US 7,061,816 B2
(45) Date of Patent: Jun. 13, 2006

(54) SEMICONDUCTOR MEMORY STORAGE DEVICE AND ITS REDUNDANT METHOD

(75) Inventors: Akira Sugiura, Kasugai (JP); Takaaki Furuyama, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/061,365

(22) Filed: Feb. 18, 2005

(65) Prior Publication Data

US 2005/0185483 A1   Aug. 25, 2005

Related U.S. Application Data

(63) Continuation of application No. PCT/JP04/02028, filed on Feb. 20, 2004.

(51) Int. Cl.
*G11C 7/00* (2006.01)
(52) U.S. Cl. .......................... 365/200; 365/63
(58) Field of Classification Search ................ 365/200, 365/63
See application file for complete search history.

(56) References Cited

U.S. PATENT DOCUMENTS

| | | | | |
|---|---|---|---|---|
| 4,918,662 | A | * | 4/1990 | Kondo .......................... 365/210 |
| 5,822,257 | A | * | 10/1998 | Ogawa .......................... 365/200 |
| 6,084,807 | A | * | 7/2000 | Choi .............................. 365/200 |
| 6,418,051 | B1 | | 7/2002 | Manstretta et al. |
| 6,643,196 | B1 | | 11/2003 | Sugio |
| 2002/0001237 | A1 | | 1/2002 | Manstretta et al. |
| 2002/0012282 | A1 | | 1/2002 | Saito et al. |

FOREIGN PATENT DOCUMENTS

| | | |
|---|---|---|
| JP | 09-128962 | 5/1997 |
| JP | 2002-269994 | 9/2002 |

OTHER PUBLICATIONS

Toru Tanzawa, et al., 44-mm$^2$ Four-Bank Eight-Word Page-Read 64-Mb Flash Memory With Flexible Block Redundancy and Fast Accurate Word-Line Voltage Controller, IEEE Journal of Solid-State Circuits, vol., 37 No. 11, p. 1485-1492, Nov. 2002.

* cited by examiner

Primary Examiner—Tuan T. Nguyen
(74) Attorney, Agent, or Firm—Ingrassia Fisher & Lorenz PC

(57) ABSTRACT

A semiconductor memory device includes a memory block having memory cells connected to global bit lines and global word lines are arranged in matrix constitutes a memory block column sharing global bit lines, the memory block column being developed in global word line wiring direction, wherein at least two of memory block columns adjoining each other constitute a to-be-remedied unit, and redundant block(s), which is/are arranged sharing global bit lines with the memory block column(s), which is/are provided in each to-be-remedied unit and number of redundant block(s) is/are smaller than that of memory block column(s) included in the to-be-remedied unit. A minimum number of redundant memory blocks necessary for defectiveness remedy can be provided thereby enhancing the yield with optimization of the manufacturing and circuits. Redundancy remedy efficiency can also be improved while minimizing increased chip die size of the semiconductor memory device.

14 Claims, 16 Drawing Sheets

(WHEN REDUNDANCY PROCESSING IS CONDUCTED)

(WHEN REDUNDANCY PROCESSING IS CONDUCTED)

(WHEN REDUNDANCY PROCESSING IS CONDUCTED)

■ :REDUNDANCY SECTOR

US 7,061,816 B2

SEMICONDUCTOR MEMORY STORAGE DEVICE AND ITS REDUNDANT METHOD

CROSS-REFERENCES TO RELATED APPLICATIONS

This is a continuation of International Application No. PCT/JP2004/002028, filed Feb. 20, 2004 which was not published in English under PCT Article 21(2).

FIELD OF THE INVENTION

The present invention relates to a semiconductor memory device having a redundancy remedy function for remedying an access-defective memory cell and a redundant method therefor. More specifically, the present invention relates to a redundancy remedy function which can cope with both area efficiency on a chip die and remedy efficiency.

BACKGROUND OF THE INVENTION

A redundancy region having a preliminary memory cell is provided. If a memory cell of a semiconductor memory device or a bit line connected to the memory cell is defective, it is well known to conduct redundancy remedy, a method which accesses the memory cell in the redundancy region with a memory cell address to be accessed.

In a non-volatile memory device having a redundancy remedy function, in addition to a column redundancy function for conducting redundancy remedy by replacing a bit line connected to a plurality of memory cells as a redundancy unit with a redundancy bit line, there may be provided a block redundancy function which enables redundancy remedy by replacing the memory block as a redundancy unit with a redundant memory block when performing batch operation such as data erase by memory block having a predetermined number of memory cells. In addition, redundancy remedy efficiency using the redundant memory block in the semiconductor memory device has a trade-off relation to increased occupied area on a chip die.

In Patent Document 1 described below, as shown in FIG. 23, a memory architecture 110 has a matrix 111 of memory cells with n×m memory sectors. The memory sectors arranged in the matrix 111 are constituted of vertical sector groups indicated by V1, V2, . . . , Vn and horizontal sector groups indicated by H1, H2, . . . , Hm. Row redundancy sectors R1, R2, . . . , Rn are provided to the vertical sector groups V1, V2, . . . , Vn, respectively.

Row address ADr to be accessed is supplied to a row decoder 112 and a memory matrix 114 storing a defective row address by vertical sector group. When the row address ADr is matched with the defective row address, a select signal to a redundancy cell row is outputted from the matrix 114 to the row decoder 112 and a column decoder 113. A sector including the defective row address is replaced with a redundancy sector belonging to the vertical sector group including the sector. The replacement with the redundancy sector is conducted by the vertical sector group.

In Patent Document 2 described below, as shown in FIG. 24, word line decoder WLDEC, bit line decoder ABLDEC, and source line decoder ASLDEC are provided by 16 cell arrays ACLA. The cell array ACLA has 64 sectors and two redundancy sectors along a bit line. The two redundancy sectors are arranged at both ends of the cell array ACLA.

The replacement with a redundancy sector is conducted by replacing a defective column address with a redundancy column by the cell array ACLA. A sector including the defective column address is replaced with a redundancy sector belonging to the cell array ACLA including the sector. The replacement with a redundancy sector is conducted by the cell array ACLA.

In the IEEE Document described below, as shown in FIG. 25, in a flash memory in which a memory cell array region is partitioned into four banks and peripheral circuits are arranged in the center portion interposed between the banks, four redundancy sectors are added to one corner of the center portion in which the peripheral circuits are arranged. Each of the redundancy sectors can be replaced with a memory sector belonging to any bank.

The memory cells in the redundancy sector are connected to exclusive word lines and exclusive bit lines and are controlled by exclusive row decoders and exclusive column decoders.

The above-described prior art documents are as follows: Patent Document 1: Japanese Patent Publication No. 2001-229691 A1; Patent Document 2: Japanese Patent Publication No. 2002-269994 A1; and IEEE Document: IEEE J. of Solid-State Circuits, vol. 37, pp. 1485–1492, November 2002.

In the techniques described in Patent Documents 1 and 2, a redundancy sector is provided by the vertical sector group (Patent Document 1) or redundancy sectors are provided by the cell array ACLA (Patent Document 2). The number of remediable access-defective portions can be increased to contribute to the enhancement of the yield of a semiconductor memory device.

Generally, access defectiveness of a memory cell in a semiconductor memory device is not constant throughout the manufacturing period and is reduced through improvement in the manufacturing process and circuit function. A number of redundancy sectors which have been necessary in the early stage of manufacturing may be unnecessary by later improvements. In such case, a number of unused redundancy sectors will be left on a chip die, resulting in increased chip size. The increased chip size means a decreased number of effective chips per semiconductor wafer. In consideration of defectiveness remedies using the redundancy sector, a decreased number of effective chips due to provision of the redundancy sector by a small unit such as the vertical sector group can increase the manufacturing cost per chip.

In the IEEE Document, the number of redundancy sectors is limited to improve the problem of increased chip size due to unused redundancy sectors. However, in the IEEE Document, the redundancy sectors are arranged in the peripheral circuit region between banks, are connected to exclusive word lines and bit lines different from those connected to the memory sectors of the banks, and have exclusive row decoders and column decoders. When the column redundancy function is provided to the redundancy sectors, the word lines and bit lines are different from those of the memory sectors of the banks. Exclusive column redundancy judge circuits must be provided.

The occupied area on a chip die on which these exclusive connections and exclusive circuits are arranged can increase the chip size. In the same manner, the manufacturing cost per chip with a decreased number of effective chips per semiconductor wafer can be increased, which is a problem.

The present invention has been made to solve at least one of the problems of the prior art. What is needed is a semiconductor memory device and a redundancy remedy method for the semiconductor memory device which can provide redundant memory block arrangement enabling efficient redundancy remedy while reducing increased chip die area and can perform efficient bias application to a redundant memory block.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention. Embodiments embodying a semiconductor memory device and a redundancy remedy method for the semiconductor memory device according to the present invention will be described in detail with reference to the drawings based on FIGS. 1 to 22.

Figure 1:
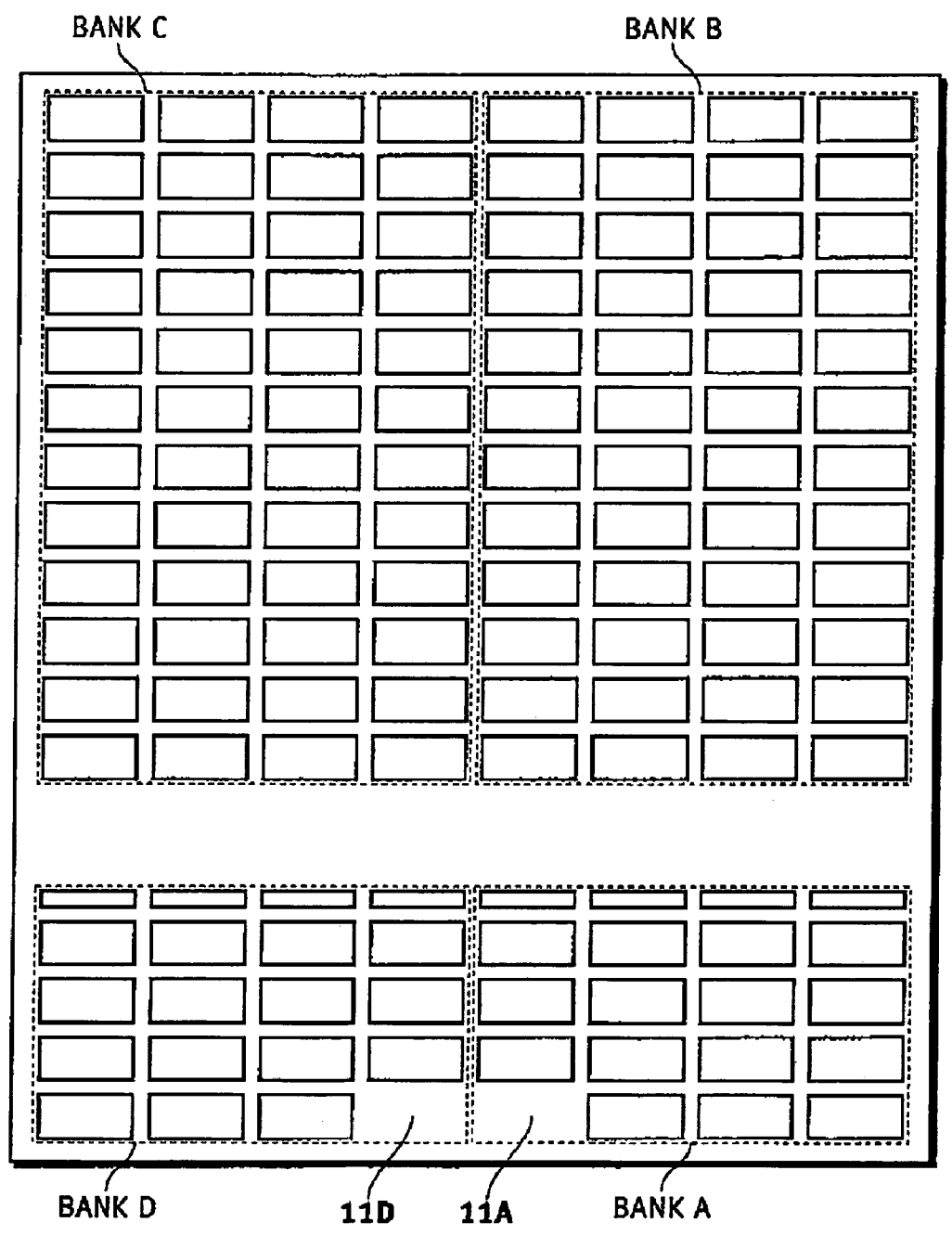
FIG. 1 is a layout schematic diagram illustrating a memory block arrangement in a semiconductor memory device.

FIG. 1 is an example showing a memory block arrangement constitution for controlling a memory cell region by predetermined memory capacity in a semiconductor memory device. In FIG. 1, the memory block arrangement shown is, for example, a flash memory, a non-volatile semiconductor memory device.

In the flash memory, a unit of a memory block is generally the smallest unit of memory capacity conducting batch erase, and is generally referred to as the sector unit. The memory blocks are arranged in a matrix formation in vertical and horizontal directions. In the following description, global bit lines are connected through the memory blocks extending in the vertical direction, and global word lines are connected in the horizontal direction. The memory blocks are arrayed in vertical direction to form a memory block column. The vertical direction is called a row direction. The horizontal direction is called a column direction.

The memory cell region is divided into banks in which access control is conducted independently. There are various methods of dividing the memory cell region into the banks depending on the specifications. In FIG. 1, there are provided two large banks securing a large capacity (banks B and C) and two small banks having a relatively small capacity (banks A and D). A memory block having one sector capacity is assigned to each of the small banks (banks A and D) as a boot sector, that is a storage area of a starting program at system boot. In this case, the boot sector may be arranged in the head address in the bank from its specificity and the boot sectors may be dividedly arranged in the upper end of the bank. In the specific arrangement, the sections for one memory block are reserved in the banks A and D as regions 11A and 11D free from memory block(s).

Figure 2:
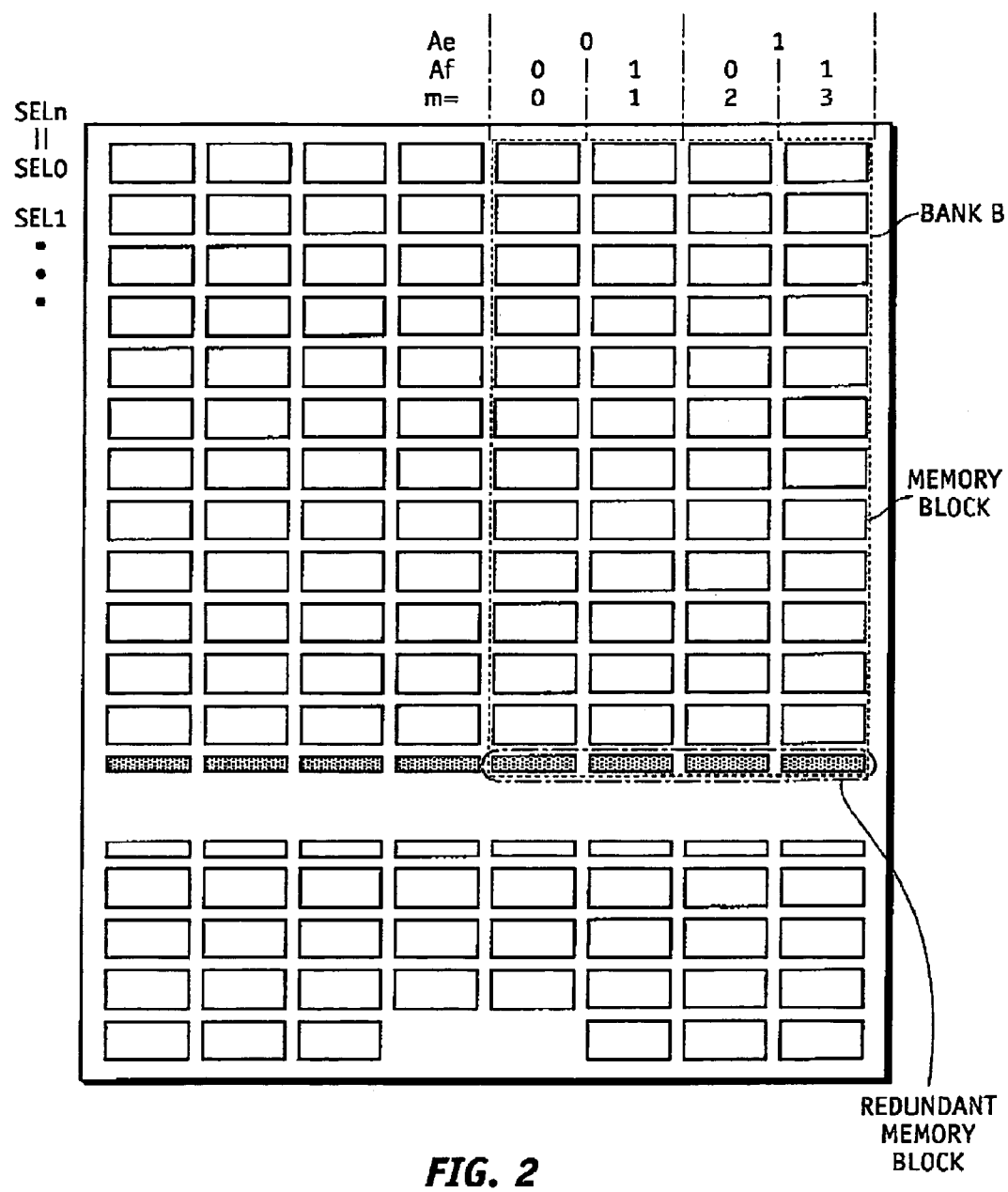
FIG. 2 is a layout schematic diagram showing a redundant memory block division arrangement according to a first embodiment.

FIG. 2 shows a first embodiment when arranging redundant memory blocks in a semiconductor memory device having the bank constitution of FIG. 1. The first embodiment will be described by taking the case of arrangement in the large banks (banks B and C) as an example. In this embodiment, redundant memory blocks are dividedly arranged at the lowest end of the memory block columns.

While bank B will be described below, it is understood by those skilled in the art that bank C can have the same construction. The small banks (banks A and D) can also have the same construction.

Addresses identifying memory block columns are address signals Ae and Af. Four memory block columns arranged in the bank B and identified by m=0 to 3 in column direction from the left end to the right side in the drawing are selected by (Ae, Af)=(0, 0), (0, 1), (1, 0) and (1, 1). Addresses having a predetermined number of bits in predetermined bit positions, not shown, identify the column direction of the memory block and are identified by memory block row identification signal SELn (n=0, 1, . . . ).

Figure 3:
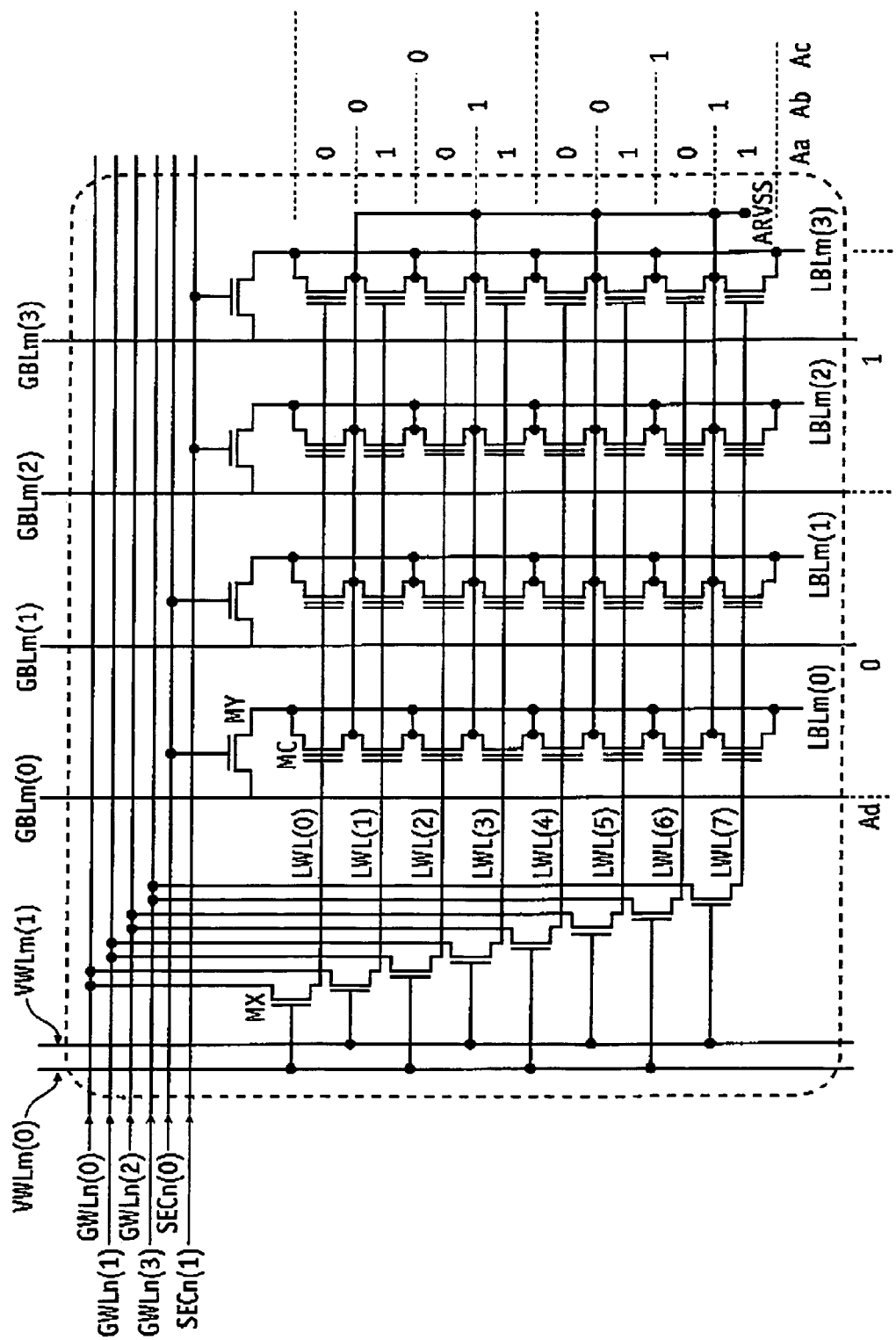
FIG. 3 is a memory block circuit diagram.
Figure 4:
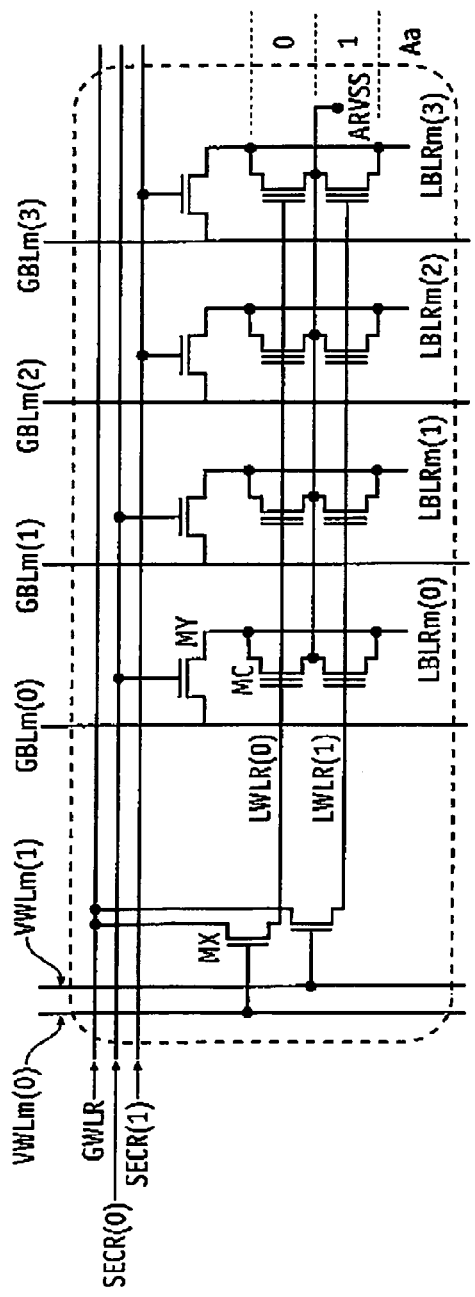
FIG. 4 is a circuit diagram showing redundancy memory sub-blocks.

FIG. 3 is a memory block circuit diagram and FIG. 4 is a circuit diagram of divided redundant memory blocks.

In the memory blocks shown in FIG. 3, eight memory cells MC arrayed in the row direction are arranged in four columns in the column direction and are connected to reference voltage ARVSS connected to a predetermined potential including a ground potential by column and local bit lines LBLm(0), LBLm(1), LBLm(2), and LBLm(3).

The local bit lines LBLm(0), LBLm(1), LBLm(2), and LBLm(3) are connected via select transistors MY to global bit lines GBLm(0), GBLm(1), GBLm(2), and GBLm(3). The connection of the global bit lines and the local bit lines is controlled by conduction of the select transistors MY. The global bit lines GBLm(0) and GBLm(1) are conductively controlled by bit line select signal SECn(0). The global bit lines GBLm(2) and GBLm(3) are conductively controlled by bit line select signal SECn(1).

In the selection of the memory cells MC, select transistors MX are selected by global word lines GWLn(0) to GWLn(3) and local word line select signals VWLm(0) and VWLm(1) to activate local word lines LWL(0) to LWL(7).

In the selection of the memory cells MC, the identification of eight cells in the row direction is conducted by address signals Aa, Ab and Ac. The identification by two columns in the column direction is conducted by address signal Ad. An electric current path is established between the two cells and a global bit line to control data access.

Redundancy memory sub-blocks shown in FIG. 4 are divided into four memory block columns for arrangement. The two memory cells MC are arranged by column. The memory blocks and the global bit lines GBLm(0) to GBLm (3) can be shared. In the same manner as FIG. 3, redundancy local bit lines LBLRm(0), LBLRm(1), LBLRm(2), and LBLRm(3) are connected to the global bit lines GBLm(0) and GBLm(3) by the select transistors MY selected by redundancy bit line select signals SECR(0) and SECR(1).

The redundancy memory sub-blocks of FIG. 4 are divided by adjoining two cells in the row direction in the memory blocks of FIG. 3. Redundancy global word line GWLR activates redundancy local word lines LWLR(0) and LWLR(1) via select transistor MX selected by the redundancy local word line select signals VWLm(0) and VWLm(1). The redundancy local word line select signals VWLm(0) and VWLm(1) can be shared with the memory blocks of FIG. 3. Two cells in the row direction can be identified by the address signal Aa like FIG. 3.

Figure 5:
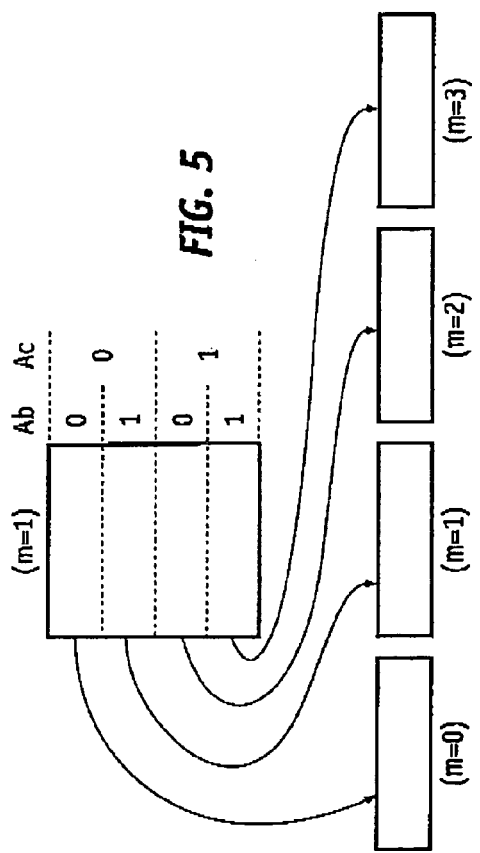
FIG. 5 is a conceptual diagram showing assignment of memory blocks to redundancy memory sub-blocks according to the first embodiment.

FIG. 5 schematically shows that divided memory blocks are redundancy remedied to redundancy memory sub-blocks in memory block columns (m=0 to 3). The redundancy memory sub-blocks divided into four are constructed in the row direction of the memory blocks. In FIG. 5, memory blocks arranged in the memory block column of m=1 are redundancy remedied. In the same manner, memory blocks arranged in other memory block columns (m=0, 2 and 3) are assigned to different redundancy memory sub-blocks by adjoining two cells identified by the address signals Ab and Ac. Specifically, dividedly, the memory cell identified by (Ab, Ac)=(0, 0) is replaced with the redundancy memory sub-block in the memory block column of m=0; the memory cell identified by (Ab, Ac)=(1, 0) is replaced with the redundancy memory sub-block in the memory block column of m=1; the memory cell identified by (Ab, Ac)=(0, 1) is replaced with the redundancy memory sub-block in the memory block column of m=2; and the memory cell identified by (Ab, Ac)=(1, 1) is replaced with the redundancy memory sub-block in the memory block column of m=3.

Figure 6:
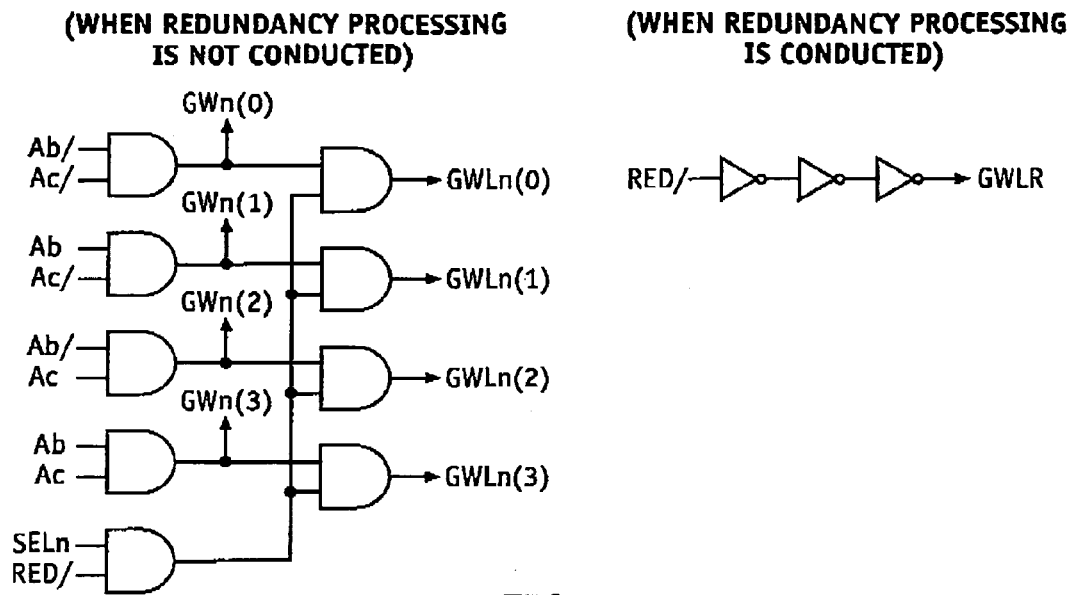
FIG. 6 shows global word line decode circuits of the first embodiment.
Figure 9:
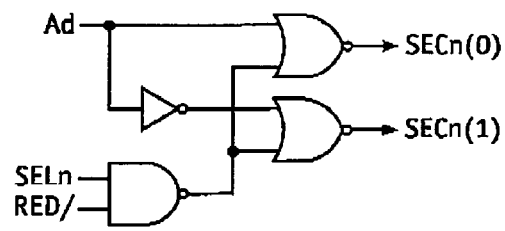
FIG. 9 shows bit line select signal decode circuits of the first embodiment.
Figure 9:
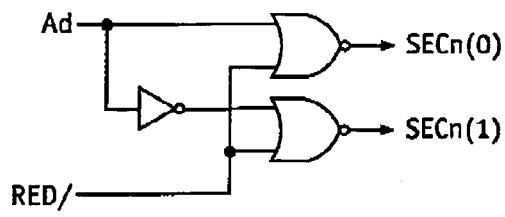
Figure 7:
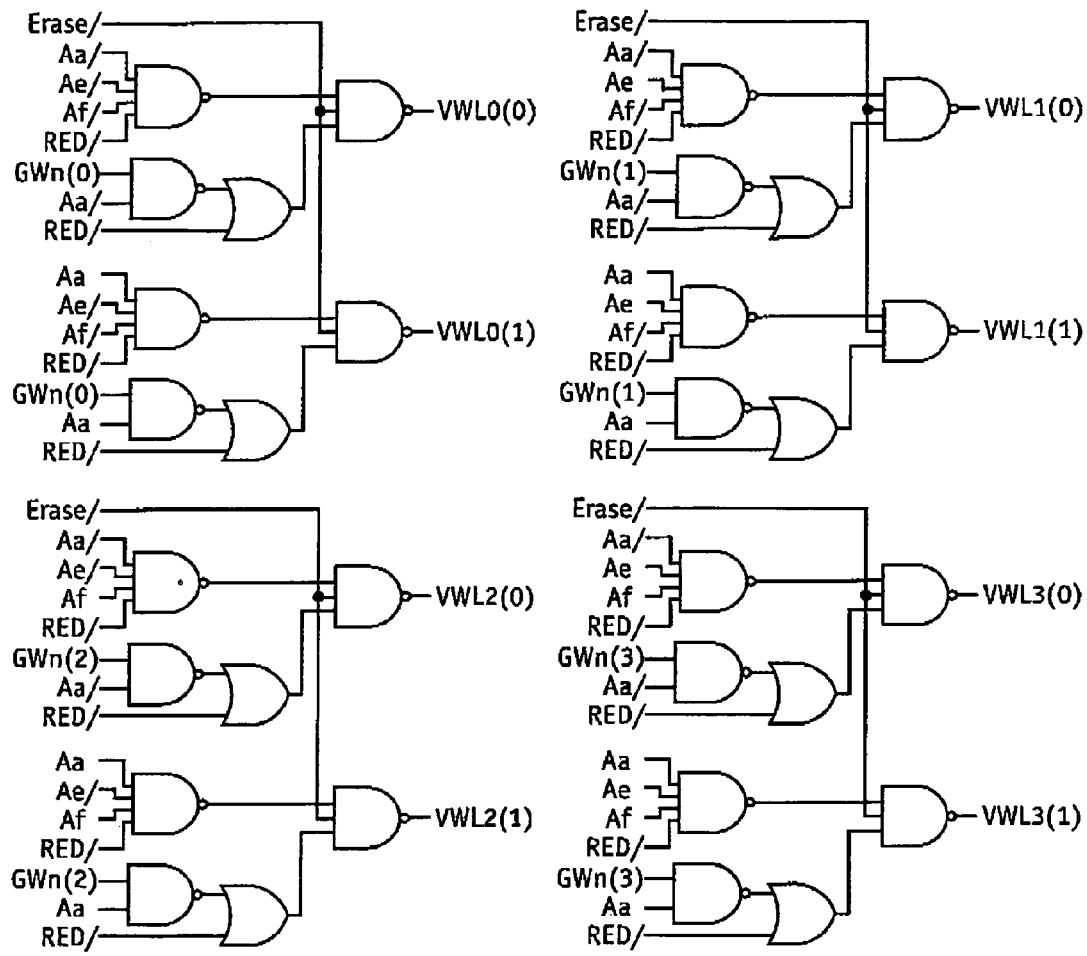
FIG. 7 shows local word line selector circuits of the first embodiment.
Figure 8:
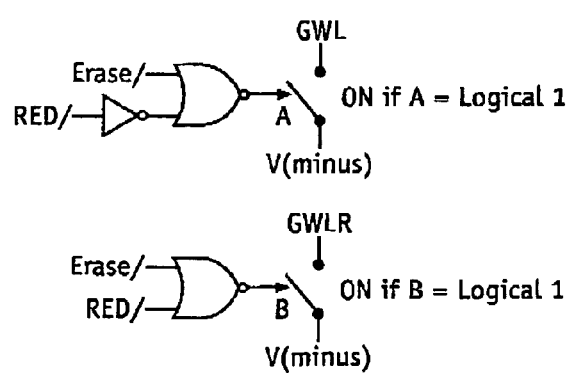
FIG. 8 shows negative bias applying circuits of global word lines in erase operation.

FIGS. 6 to 9 show circuit examples realizing division replacement at redundancy remedy based on the circuit constitutions of FIGS. 3 and 4. FIG. 6 shows global word line decode circuits. FIG. 7 shows local word line selector circuits. FIG. 8 shows a negative bias applying circuit in an erase operation by the global word line. And FIG. 9 shows bit line select signal decode circuits.

In FIG. 6, in the global word line decode circuit in the case where redundancy processing is not conducted, an AND computation is performed to the logic combinations of the address signals Ab and Ac to output sub-block identification signals GWn(0) to GWn(3) so that eight cells in the row direction in the memory blocks are identified as sub-blocks by two cells. The sub-block identification signals GWn (0) to GWn(3) are AND computed with an AND computation output signal of non-redundancy signal RED/ and the memory block row identification signal SELn to output the global word line signals GWLn(0) and GWLn(3). The AND computation output of the non-redundancy signal RED/ and the memory block row identification signal SELn is activated in accordance with the non-redundancy signal (RED/=Hi) indicating that redundancy processing is not conducted and the memory block row identification signal (SELn=Hi) indicating that a memory block row is selected. The global word line signal (any one of GWLn(0) to GWL(3)) corresponding to a sub-block identified by the address signals Ab and Ac is activated to a memory block row selected in the case where redundancy processing is not conducted.

In the global word line decode circuit in the case where redundancy processing is conducted, the activation and inactivation of the redundancy global word line GWLR are controlled in accordance with the logic inversion of the non-redundancy signal RED/ irrespective of the address signals Ab and Ac. As the non-redundancy signal RED/ is at low level (RED/=Lo) in the case where redundancy processing is conducted, the redundancy global word line GWLR is activated to a high level. The redundancy global word line GWLR is sharably connected through redundancy memory sub-blocks dividedly arranged in memory block columns and is activated in the case where redundancy processing is conducted, thereby sharably providing an activation signal to all the redundancy memory sub-blocks.

FIG. 7 shows selector circuits of the local word line select signals VWL(0) to VWL3(1). The logic combinations of the address signals Aa, Ae and Af are inputted to a NAND logic gate with the non-redundancy signal RED/. One of the address signals Aa, Ae and Af in eight combinations is selected in case redundancy processing is not conducted (RED/=Hi) to output low level. In the later-stage NAND logic gate to which the output signal at low level is inputted, a high level signal is outputted irrespective of the other two input signals to select any one of the local word line select signals (VWL0(0) to VWL3(1)). One of the memory block columns (m=0 to 3) is selected based on the address signals Ae and Af (see FIG. 2). The local word line select signal VWLm(0) or VWLm(1) (m=0 to 3) in the memory block column is selected based on the address signal Aa (see FIGS. 2 and 3).

A second input signal is non-erase signal Erase/ of the three signals inputted to the later-stage NAND logic gate. It is at a low level at erase to activate the local word line select signals VWL0(0) to VWL3(1) together to high level so that the global word lines are connected to the local word lines. In the negative bias circuit of the global word line GWL and the redundancy global word line GWLR in the erase operation shown in FIG. 8, the non-erase signal Erase/ is at low level in case redundancy processing is conducted (RED/=Lo) to conduct the switch. The redundancy global word line GWLR is biased to negative voltage. The redundancy global word line GWLR is sharably connected to all the redundancy memory sub-blocks forming the redundant memory blocks. The batch erase operation can thus be performed to the redundant memory blocks.

A third input signal is an output signal of the OR computation circuit. To the OR computation circuit, the non-redundancy signal RED/ and the output signal of the NAND logic gate circuit of the sub-block identification signals GWn(0) to GWn(3) and the address signal Aa selecting the local word line select signal (any one of the VWLm(0) and VWLm(1) (m=0 to 3) are inputted. When the sub-block identification signal and the address signal Aa are both at a high level in the case where redundancy processing is conducted (RED/=Lo), the output signal of the OR computation circuit is at a low level. Sub-blocks by two cells of eight cells in the row direction of the memory blocks are identified by the sub-block identification signals GWn(0) to GWn(3) to identify redundancy memory sub-blocks arranged by memory block column. Specifically, the block row of two cells identified by the sub-block identification signal GWn(0) in a memory block is replaced with the redundancy memory sub-block in the memory block column of m=0. In the same manner, the block rows of two cells identified by the sub-block identification signals GWn(1) to GWn(3) are replaced with the redundancy memory sub-blocks in the memory block columns of m=1 to 3. The identification in a redundancy memory sub-block is conducted by the address signal Aa.

In FIG. 9, in the bit line select signal decode circuit in the case where redundancy processing is not conducted, the output signal of the NAND logic gate by the non-redundancy signal RED/ and the memory block row identification signal SELn, the address signal Ad, and its reverse-phase signal are inputted to the NOR logic gates to output the bit line select signal SECn(0) and SECn(1). As the output signal at low level is outputted from the NAND logic gate in accordance with the non-redundancy signal (RED/=Hi) indicating that redundancy processing is not conducted and the memory block row identification signal (SELn=Hi) indicating that a memory block row is selected, the address signal Ad and its reverse-phase signal are inverted to output the bit line select signals SECn(0) and SECn(1). As shown in FIG. 3, the address signal Ad is an identification signal by two columns in the column direction in a memory block.

In FIG. 9, in the bit line select signal decode circuit in the case where redundancy processing is conducted, the non-redundancy signal RED/ is inputted to the NOR logic gate instead of the output signal of the NAND logic gate in the circuit in the case where redundancy processing is not conducted. The bit line select signals SECn(0) and SECn(1) are outputted in accordance with the address signal Ad and its reverse-phase signal in the case where redundancy processing is conducted (RED/=Lo).

Figure 10:
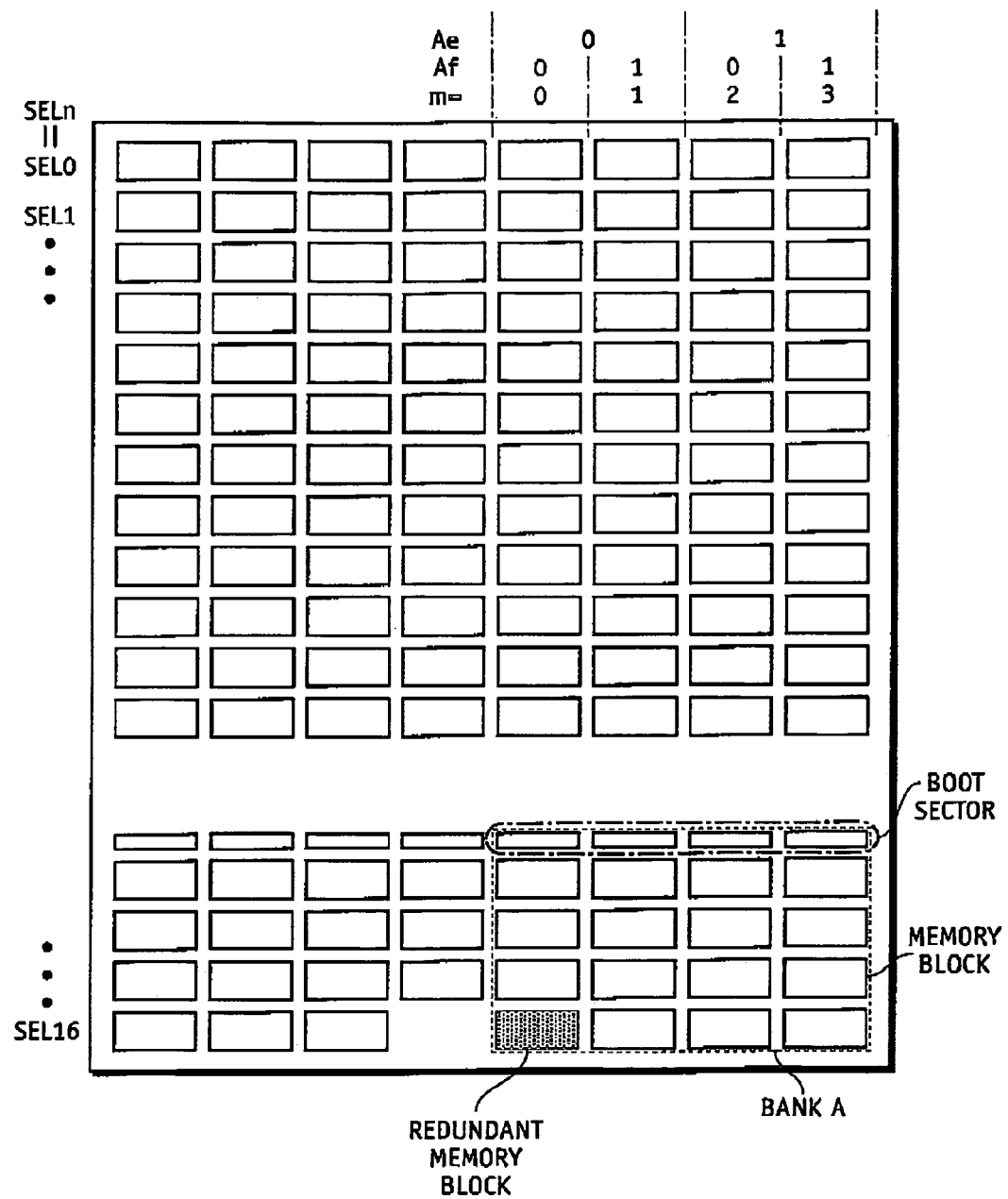
FIG. 10 is a layout schematic diagram illustrating a redundant memory block arrangement according to a second embodiment.

FIG. 10 shows a second embodiment when a redundant memory block is arranged in the semiconductor memory device having the bank construction of FIG. 1. The second embodiment will be described by taking the case of the arrangement in the small banks (banks A and D) as an example. In this embodiment, a redundant memory block is arranged on a region free from memory block(s) in a memory block column.

While the bank A will be described below, it is understood by those skilled in the art that the bank D can have the same constitution. The large banks (banks B and C) can have the same construction when a region free from memory block(s) exists.

In the bank A, memory blocks with head address are boot sectors and are dividedly arranged in the highest position of the bank by memory block column, and an open region for one block occurs in the lowest position. In FIG. 10, there exists a region free from memory block(s) in the memory block column of m=0, in a memory block row indicated by SEL16. A redundant memory block is arranged in the region free from memory block(s). The memory blocks and the redundant memory block according to the second embodiment have the same circuit constitution as that of the memory blocks shown in FIG. 3.

Figure 11:
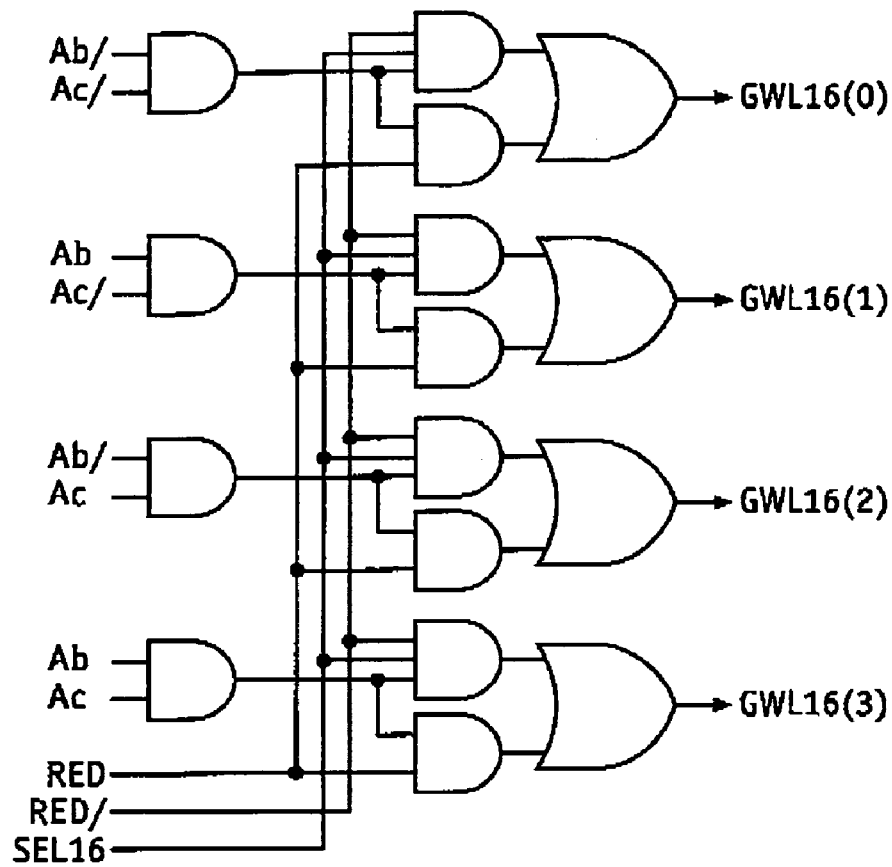
FIG. 11 shows a global word line decode circuit of the second embodiment.
Figure 13:
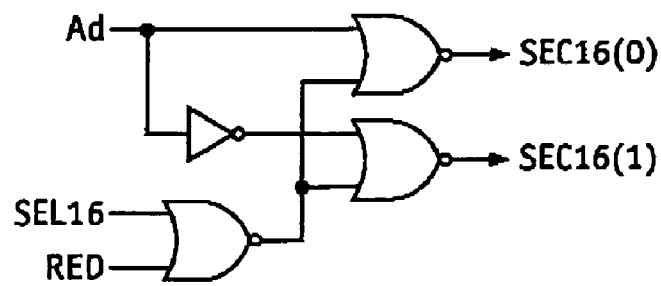
FIG. 13 shows a bit line select signal decode circuit of the second embodiment.
Figure 12:
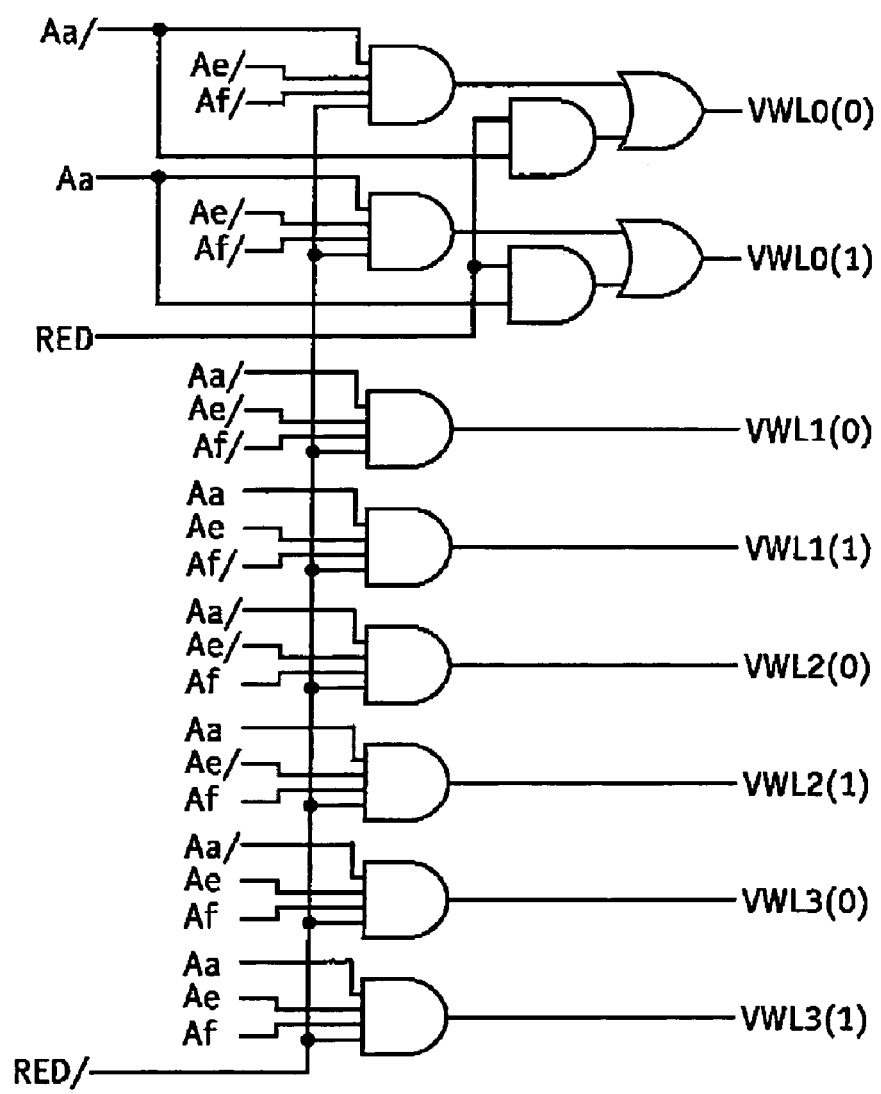
FIG. 12 shows a local word line selector circuit of the second embodiment.

FIGS. 11 to 13 show circuit examples describing a redundancy remedy based on the circuit construction of FIG. 3. FIG. 11 shows a global word line decode circuit. FIG. 12 shows a local word line selector circuit. FIG. 13 shows a bit line select signal decode circuit.

In FIG. 11, the global word line decode circuit in the case where redundancy processing is not conducted is the same as the circuit of the first embodiment shown in FIG. 6 and the description is omitted here. In the global word line decode circuit in the case where redundancy is conducted, the output signal which has been subject to AND computation to the logic combination of the address signals Ab and Ac (see FIG. 3) is inputted to two later-stage AND circuits. The memory block row identification signal SEL16 indicating a block row in which a redundant memory block is arranged and the non-redundancy signal RED/ are inputted to one of the later-stage AND circuits. Redundancy signal RED is inputted to the other later-stage AND circuit. The output signals of the later-stage AND circuits are inputted to the OR circuit. When a redundant memory block row is selected (SEL16=Hi) in the case where redundancy processing is not conducted (RED/=Hi) by one of the AND circuits, or in the case where redundancy processing is conducted (RED=Hi) by the other AND circuit, the global word line (any one of GWL16(0) to GWL16(3)) corresponding to the address signals Ab and Ac is activated.

When a memory block arranged in the memory block row SEL16 is accessed in the case where redundancy processing is not conducted by one of the AND circuits, or in the case where redundancy processing is conducted by the other AND circuit, the global word line of the block row SEL16 is activated. Any one of four global word lines is selected to be activated. A region free from memory block(s) in which a redundant memory block is arranged is the same as the block row SEL16 in which a memory block is arranged, thereby sharing a global word line. The memory block in the block row SEL16 and the redundant memory block can select a global word line by the same address signals Ab and Ac.

FIG. 12 shows a selector circuit of the local word line select signals VWL0(0) to VWL3(1). The logic combinations of the address signals Aa, Ae and Af are inputted to the AND circuit with the non-redundancy signal RED/. Except when the address signals Ae and Af are both at low level (Ae/=Af/=Hi), the output signals of the AND circuits are the local word line select signals VWL1(0) to VWL3(1). The local word line select signals VWL1(0) to VWL3(1) selecting the memory block columns (m=1 to 3) other than the memory block column (m=0) in which a redundant memory block is arranged are selected.

In the selection of the local word line select signals VWL0(0) and VWL0(1), the output signal of the AND circuit of the address signals Aa, Ae and Af is OR computed with the AND computation result by the redundancy signal RED and the address signal Aa to be outputted. When the address signals Ae and Af are the select signals in the memory block column of m=0 and are both at low level (Ae/=Af/=Hi) in case redundancy processing is not conducted (RED/=Hi), they are selected in accordance with the address signal Aa. A signal corresponding to the address signal Aa is selected in case redundancy processing is conducted (RED=Hi).

In FIG. 13, the bit line select signal decode circuit in the case where redundancy processing is not conducted is the same as the circuit of the first embodiment shown in FIG. 9 and the description is omitted here. In the bit line select signal decode circuit in the case where redundancy processing is conducted, instead of the non-redundancy signal RED/ in the circuit of FIG. 9, the output signal of the NOR logic gate of the memory block row identification signal SEL16 and the redundancy signal RED is inputted to the NOR logic gate. In the memory block row of the SEL16, the bit line select signals SEC16(0) and SEC16(1) are outputted in accordance with the address signal Ad and its reverse-phase signal in the case where redundancy processing is conducted (RED/=Lo).

Figure 14:
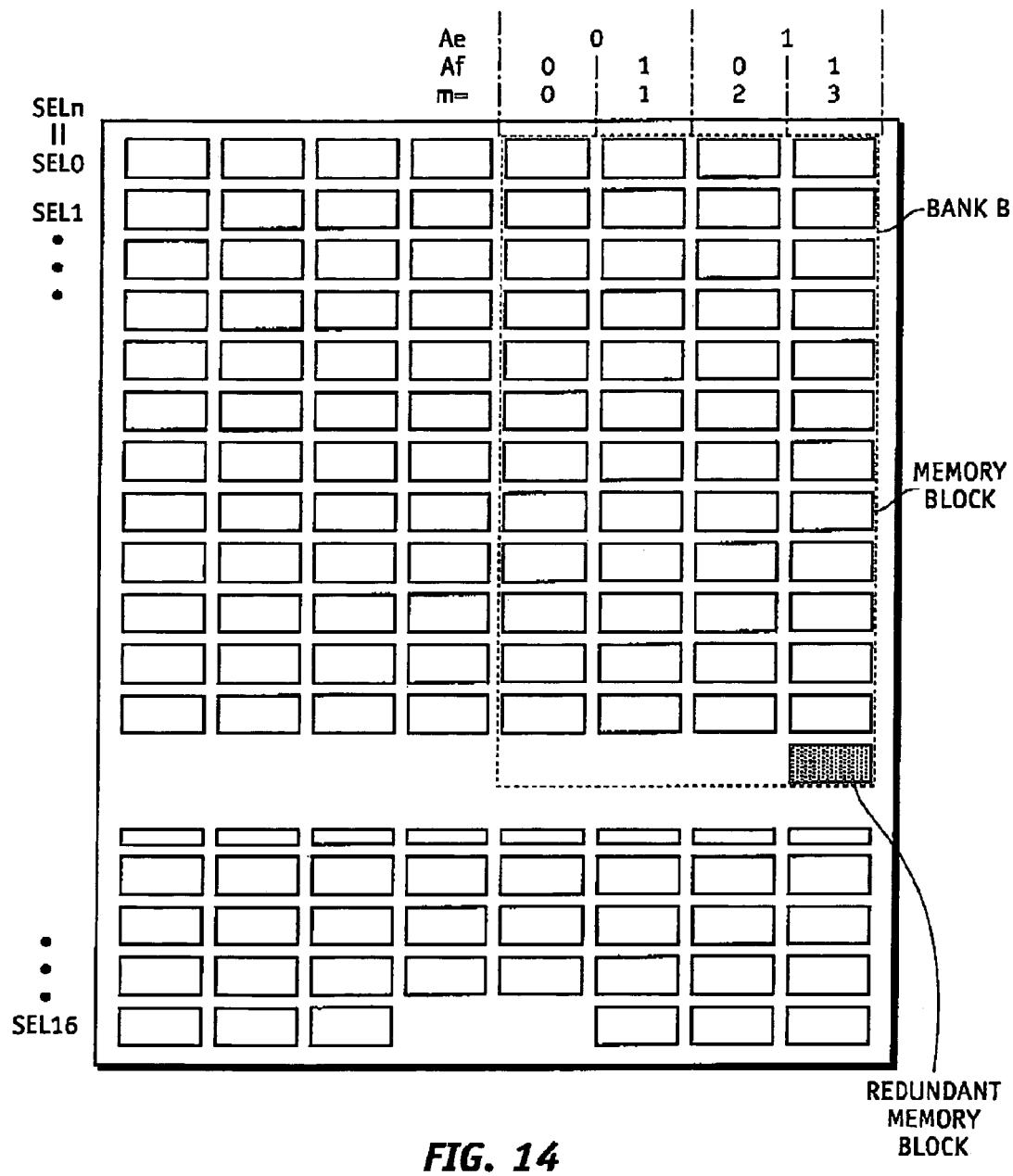
FIG. 14 is a layout schematic diagram illustrating a redundant memory block arrangement according to a third embodiment.

FIG. 14 shows a third embodiment of arranging a redundant memory block in the semiconductor memory device having the bank construction of FIG. 1. The third embodiment will be described by taking the case of arrangement in a large bank (bank B) as an example. In this embodiment, a redundant memory block is arranged at the lowest end of a memory block column. The bank C and the small banks (banks A and D) can have the same construction. A redundant memory block is arranged in part of the peripheral circuit region between the large bank B and the small bank A sharing a global bit line in the same memory block column (m=3). An exclusive global bit line and a decode circuit therefor are unnecessary and the occupied area on a chip die due to the redundant memory block arrangement can therefore be minimized.

Instead of the lowest end of a memory block column, the same function and effect can be obtained when a redundant memory block is arranged at the highest end. In a memory block column in which a redundant memory block is arranged, the same function and effect can be obtained in any one of the positions of m=0 to 2 in addition to m=3. It can be arranged in a suitable position in accordance with the arrangement of the peripheral circuit such as a Y decoder and wiring. Thus, an arrangement which minimizes the influence on the circuit arrangement in the peripheral region is possible.

Figure 15:
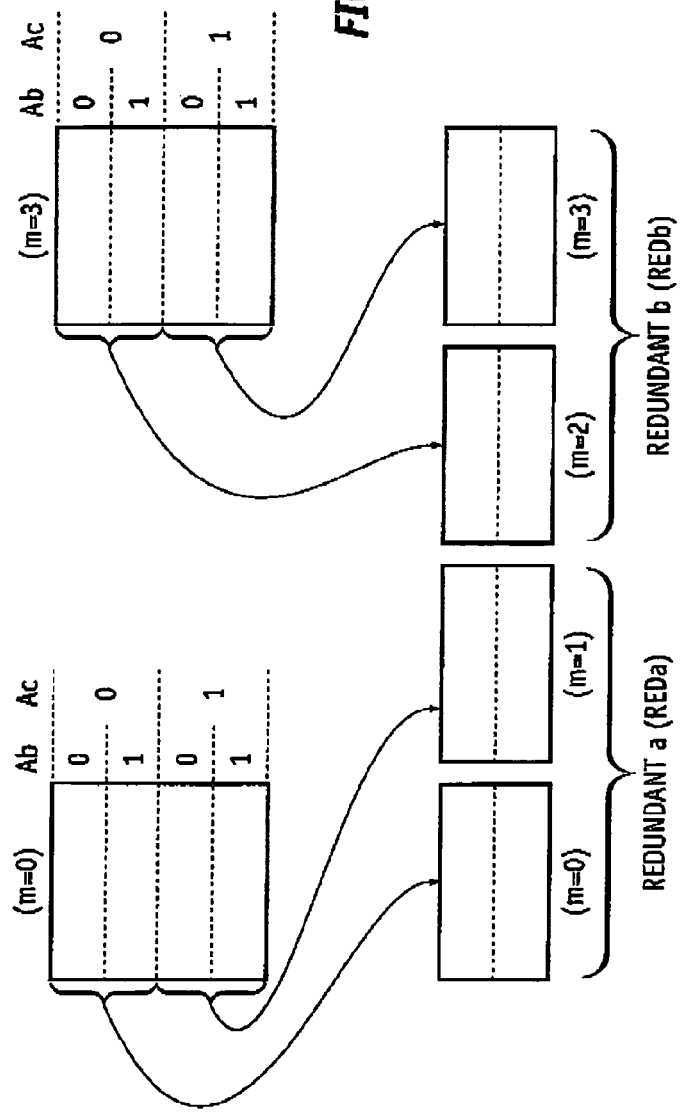
FIG. 15 is a conceptual diagram showing assignment of memory blocks to redundancy memory sub-blocks according to a fourth embodiment.

A fourth embodiment shown in FIG. 15 is an embodiment where divided redundancy memory sub-blocks are arranged by memory block column. In the first embodiment (FIG. 2), redundancy memory sub-blocks are divided into four in the row direction. In the fourth embodiment, redundancy memory sub-blocks are divided into two in the row direction. In FIG. 15, two memory blocks arranged in the memory block columns of m=0, 3 are redundancy remedied. The memory blocks arranged in the memory block column of m=0 or 1 are replaced with the redundancy memory sub-blocks arranged in the memory block columns of m=0 and 1. The memory blocks arranged in the memory block column of m=2 or 3 are replaced with the redundancy memory sub-blocks arranged in the memory block columns of m=2 and 3.

A memory block is assigned to a different redundancy memory sub-block by adjoining four cells in the row direction identified by the address signals Ab and Ac. Specifically, in the memory blocks arranged in the memory block columns of m=0 and 1 or m=2 and 3, dividedly, the memory cell identified by (Ab, Ac)=(0, 0) and (1, 0) is replaced with the redundancy memory sub-block of the memory block column of m=0 or m=2. The memory cell identified by (Ab, Ac)=(0, 1) and (1, 1) is replaced with the redundancy memory sub-block of the memory block column of m=1 or m=3.

When a to-be-remedied unit is formed in the memory block columns of m=0 and 1, the redundancy of the memory block arranged therein is redundancy a and is designated by redundancy signal REDa. When a to-be-remedied unit is formed in the memory block columns of m=2 and 3, the redundancy of the memory block arranged therein is redundancy b and is designated by redundancy signal REDb.

Generally, in the to-be-remedied unit in which redundancy memory sub-blocks are dividedly arranged, the block size of the redundancy memory sub-blocks is obtained by dividing the block size of a memory block by a factor (1 is excluded) for factorization of the number of memory block columns forming the to-be-remedied unit. When the to-be-remedied unit is constructed of four memory block columns as shown in the first embodiment, the factors for factorization are 2 and 4. The block size of a redundancy memory sub-block is ½ (FIG. 15) and ¼ (FIG. 5) of a memory block. When the to-be-remedied unit is constructed of eight memory block columns, the factors for factorization are 2, 4 and 8. The block sizes of a redundancy memory sub-block are ½, ¼, and ⅛ of a memory block.

Figure 16:
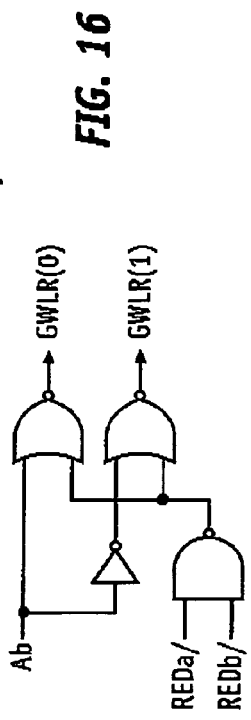
FIG. 16 shows a global word line decode circuit of the fourth embodiment.
Figure 17:
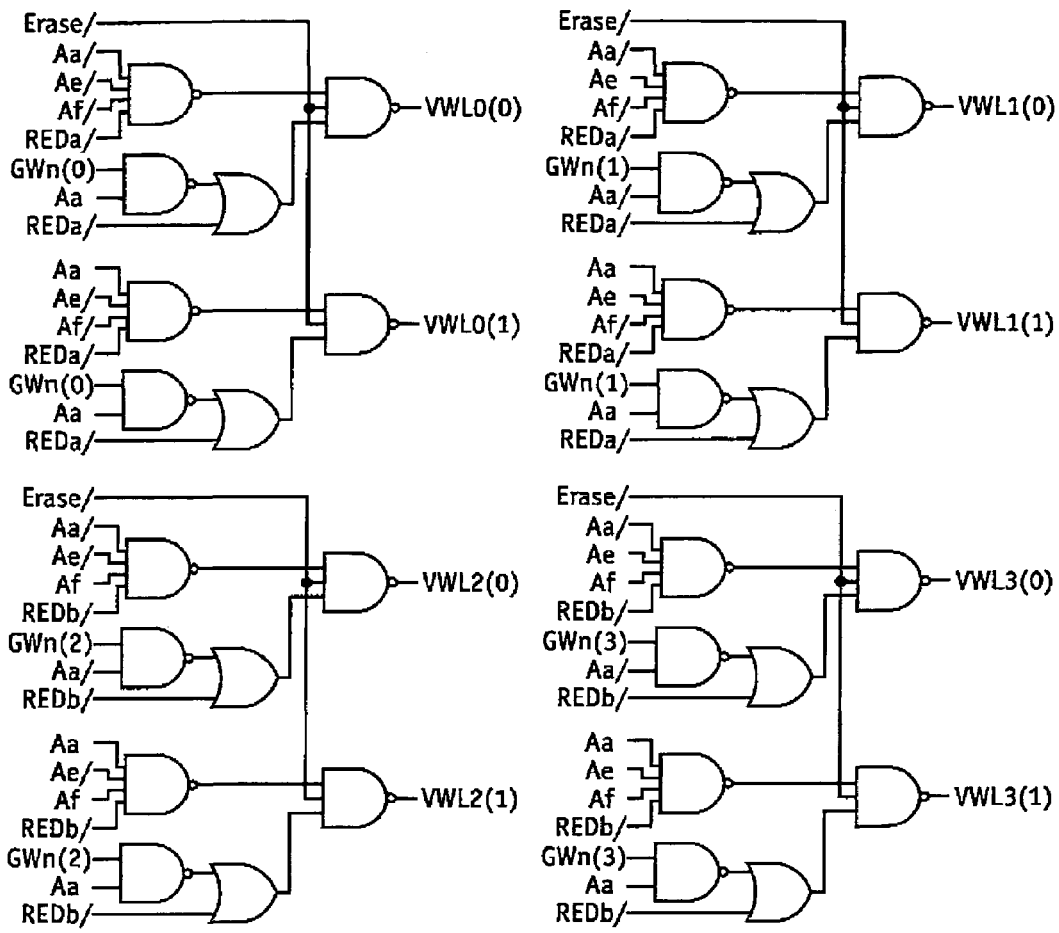
FIG. 17 shows local word line selector circuits of the fourth embodiment.
Figure 18:
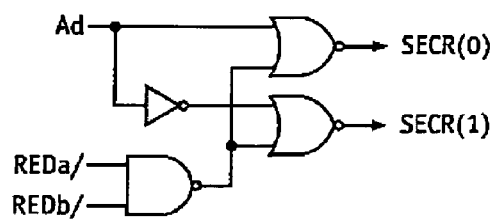
FIG. 18 is a bit line select signal decode circuit of the fourth embodiment.

FIGS. 16 to 18 show circuit examples describing the division replacement of the fourth embodiment. FIG. 16 shows a global word line decode circuit. FIG. 17 shows a local word line selector circuit. FIG. 18 shows a bit line select signal decode circuit.

In FIG. 16, the global word line decode circuit in the case where redundancy processing is not conducted is the same as the first embodiment shown in FIG. 6 and the description is omitted here. In the global word line decode circuit in the case where redundancy processing is conducted, the output signal of the AND circuit of the non-redundancy signals REDa/ and REDb/, the address signal Ab, and its reverse-phase signal are inputted to the NOR logic gates to output the redundancy global word line signals GWLR(0) and GWLR(1). As the output signal at low level is outputted from the AND circuit in accordance with the non-redundancy signal (REDa/=Lo or REDb/=Lo) indicating that at least one of the redundancy a and b is redundancy, the address signal Ab and its reverse-phase signal are inverted to output the redundancy global word line signals GWLR(0) and GWLR(1). As shown in FIG. 3, the address signal Ab is an address signal identifying adjoining two cells in the row direction.

In the local word line selector circuit of FIG. 17, instead of the non-redundancy signal RED/ in the circuit diagram of the first embodiment shown in FIG. 7, in the selection of the local word line select signals VWL0(x) and VWL1(x) (x=0 and 1), the non-redundancy signal REDa/ is inputted. In the selection of the local word line select signal VWL2(x) and VWL3(x) (x=0 and 1), the non-redundancy signal REDb/ is inputted. The non-redundancy signal REDa/ indicates redundancy a and controls the redundancy of the memory block columns of m=0 and 1. The non-redundancy signal REDb/ indicates redundancy b and controls the redundancy of the memory block columns of m=2 and 3. The circuit constitutions of the selector circuits are the same as FIG. 7 and have the same function and effect, and the description is omitted here.

Instead of the non-redundancy signal RED/ in the circuit diagram of the first embodiment shown in FIG. 9, in the bit line select signal decode circuit of FIG. 18, the output signal of the NAND circuit of the non-redundancy signals REDa/ and REDb/ is inputted to the other input terminal of the NOR logic circuit to which the address signal Ad and its reverse-phase signal are inputted. The redundancy bit line select signals SECR(0) and SECR(1) are outputted as the output signal of the NOR logic gate.

It can be seen that the the bit line select signal decode circuit of FIG. 18 has the same circuit construction as the circuit of FIG. 16 except that the address signal Ad is inputted instead of the address signal Ab.

FIGS. 19 to 22 show two examples of well regions in which memory block columns including redundant memory blocks are accommodated in the redundant memory block division arrangement according to the first embodiment and show well bias circuits of such examples.

When memory cells constituting a memory block and a redundant memory block are electrically rewritable non-volatile memory cells, it is considered that memory information is rewritten or erased by voltage bias to the terminals of the memory cells including well potential. When performing the same access operation to a plurality of memory cells such as erase operation, the access operation is preferably performed together in a unit of memory block and a redundant memory block as in the sector erase operation in a non-volatile memory device. Redundant memory blocks dividedly arranged by memory block column as redundancy memory sub-blocks are preferably arranged in an identical well region beyond a memory block column.

Figure 19:
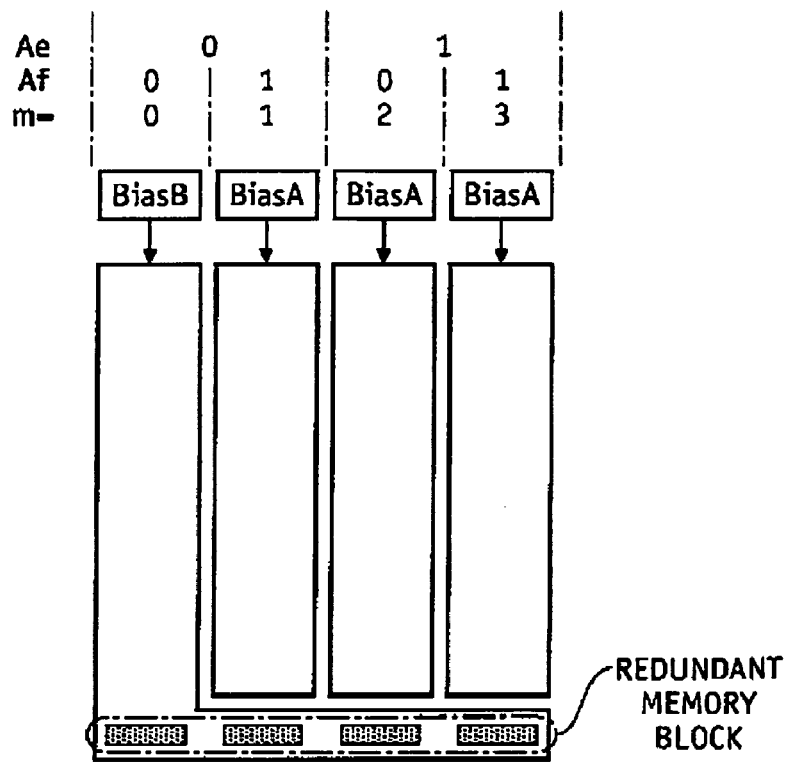
FIG. 19 is a layout schematic diagram showing a first well division example including redundant memory blocks in the redundant memory block division arrangement according to the first embodiment.

In the first well division example shown in FIG. 19, the well region in which a redundancy memory sub-block arranged beyond a memory block column is depicted integrated with the well region in which the memory block column of m=0 is arranged and is separated from the well region in which the memory block columns of m=1 to 3 are arranged. Bias circuits A are provided to the well region arranged in the memory block columns of m=1 to 3. Bias circuit B is provided to the well region in which the memory block column and the redundant memory block of m=0 are arranged. Voltage application is conducted by the well region as needed.

Figure 20:
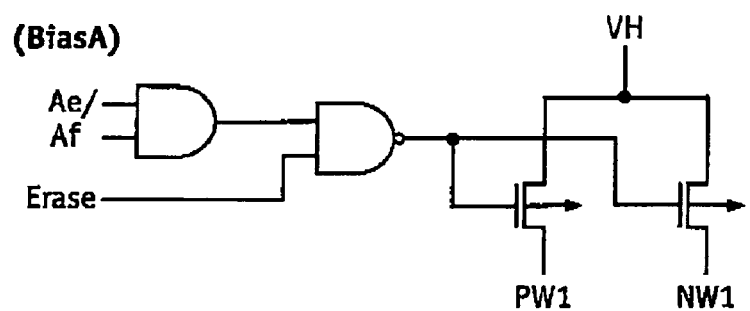
FIG. 20 shows well bias circuits of the first well division example.
Figure 20:
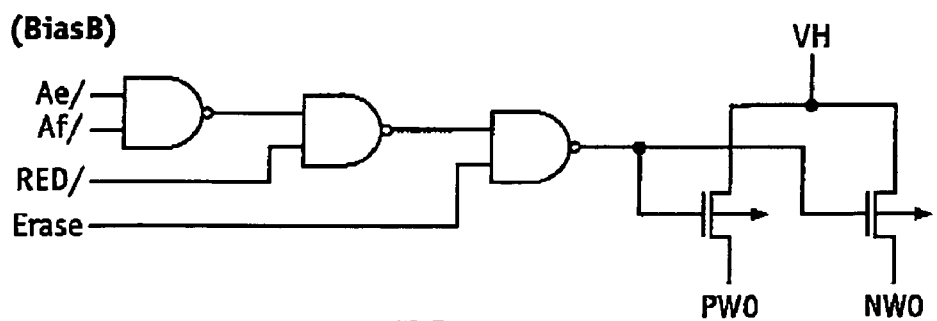

FIG. 20 shows specific examples of the bias circuits A and B. They are circuits biasing the well region during the erase operation. Bias circuits A are circuits biasing the well region in which the memory block columns of m=1 to 3 are arranged. FIG. 20 shows the case of identifying the memory block column of m=1 (Ae/=Af/=Hi). The AND computation result of the address signals Ae/and Af and the erase signal Erase are inputted to the NAND logic gate to conductively control a PMOS transistor biasing the well region. The case that the well region has a double well constitution of P well PW1 and N well NW1. It can be constructed in the same manner in accordance with the logic combination of the address signals Ae and Af inputted to the AND computation circuit for m=2 and 3.

In the erase operation (Erase=Hi), the output signal of the NAND logic gate is at low level for the well region selected by the address signals Ae and Af to conduct the PMOS transistor. The P/N well region can be biased by high voltage level bias voltage VH as well bias at erase.

The bias circuit B is a circuit biasing the well region in which the memory block column and the redundant memory block of m=0 are arranged. Instead of the AND computation circuit in the bias circuits A to which the address signals Ae/ and Af are inputted, the bias circuit B has a previous-stage NAND logic gate to which the address signals Ae/ and Af/ indicating m=0 and a later-stage NAND logic gate to which the output signal of the previous-stage NAND logic gate and the non-redundancy signal RED/ are inputted. The output signal of the later-stage NAND logic gate is inputted to a last-stage NAND logic gate with erase signal Erase.

The output signal of the later-stage NAND logic gate is at a high level in accordance with the selection of the memory block column of m=0 (Ae/=Af/=Hi) in the case where redundancy processing is not conducted (RED/=Hi). In the setting of the erase operation (Erase=Hi), the output signal of the last-stage NAND logic gate is at a low level to conduct the PMOS transistor. The P/N well region can be biased by the high voltage level bias voltage VH as well bias at erase.

The output signal of the later-stage NAND logic gate is at a high level irrespective of the logic combination of the address signals Ae and Af in the case where redundancy processing is conducted (RED/=Lo). In the setting of the erase operation (Erase=Hi), the output signal of the last-stage NAND logic gate is at a low level to conduct the PMOS transistor. The P/N well region can be biased by the high voltage level bias voltage VH as well bias at erase.

Figure 21:
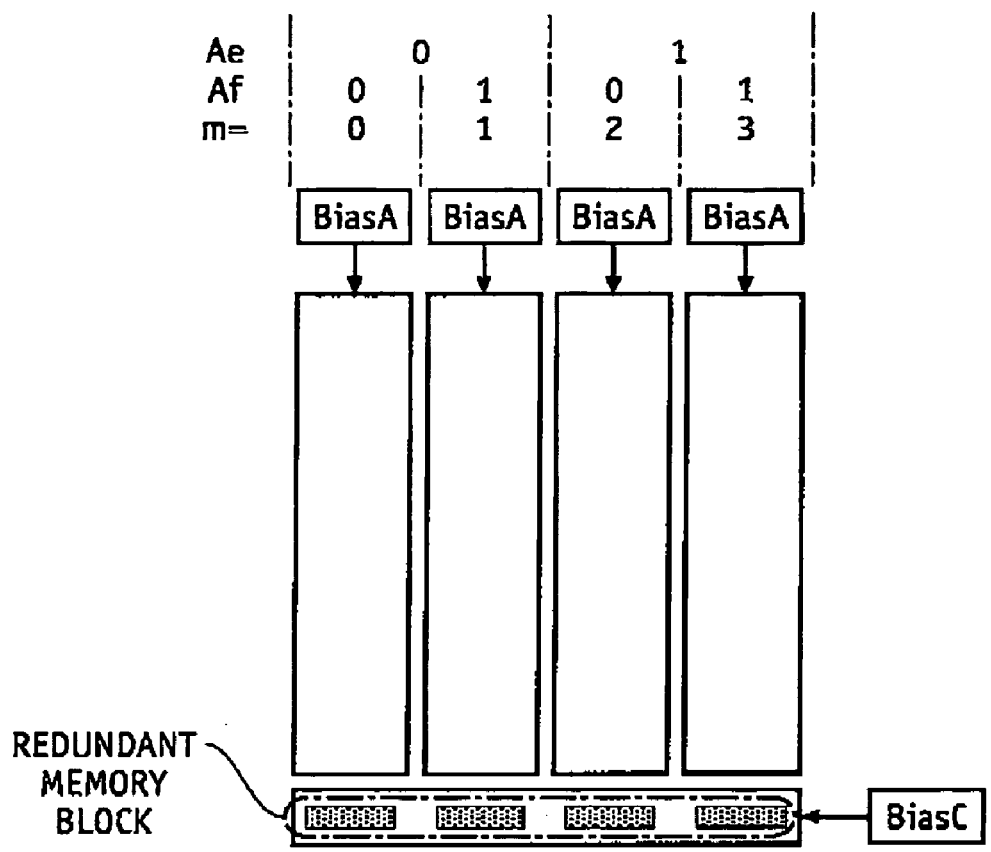
FIG. 21 is a layout schematic diagram showing a second well division example including redundant memory blocks in the redundant memory block division arrangement according to the first embodiment.

In a second well division example shown in FIG. 21, the well region in which a redundancy memory sub-block arranged beyond a memory block column is arranged is a single well region not connected to any memory block column of M=0 to 3 and is independently separated from the well region in which the memory block columns of m=0 to 3 are arranged. The bias circuits A are provided to the well region arranged in the memory block columns of m=0 to 3. Bias circuit C is provided to the well region in which a redundant memory block is arranged. Voltage application is conducted by the well region as needed.

Figure 22:
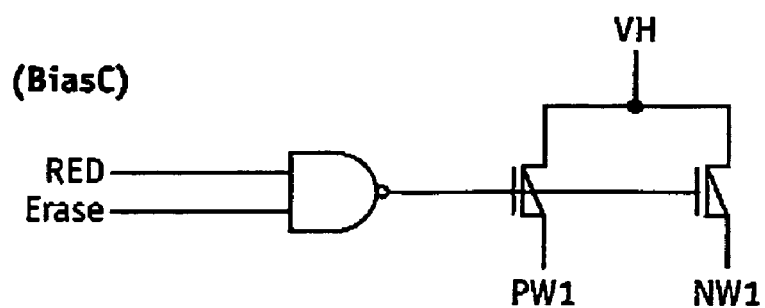
FIG. 22 is a well bias circuit of the second well division example.
Figure 23:
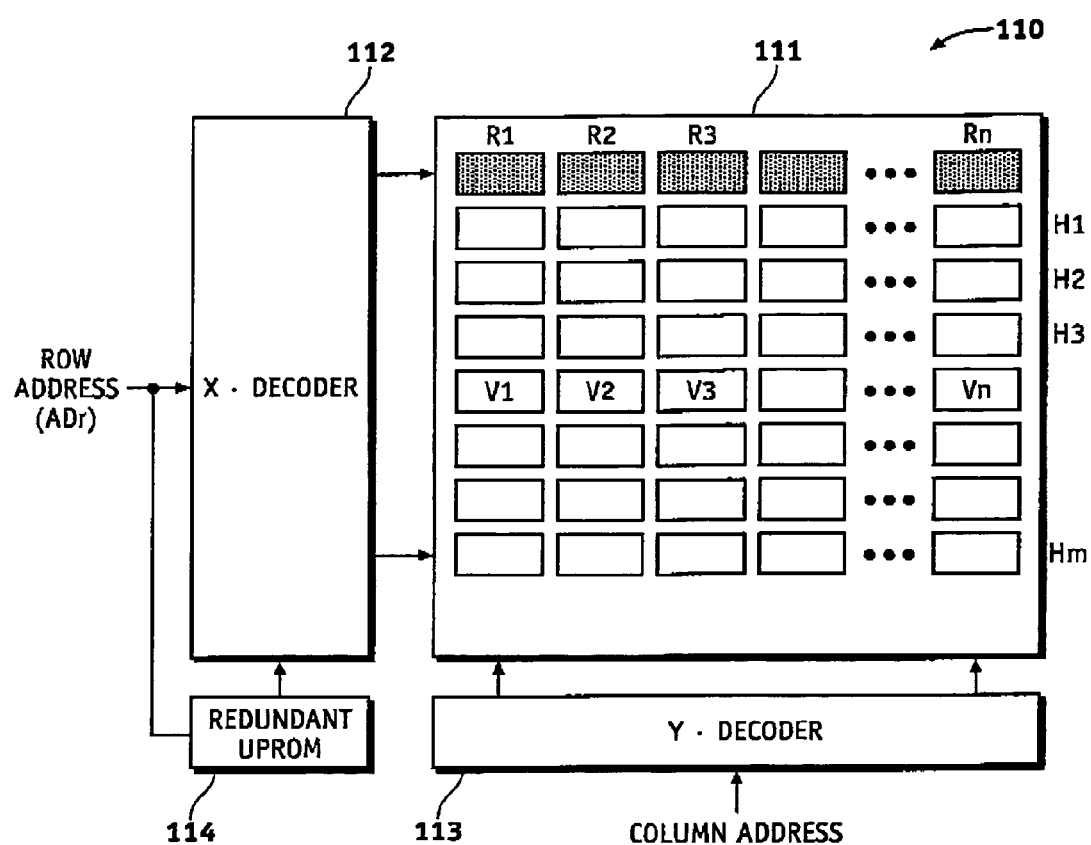
FIG. 23 is a conceptual diagram showing a redundancy sector constitution in accordance with Patent Document 1.
Figure 24:
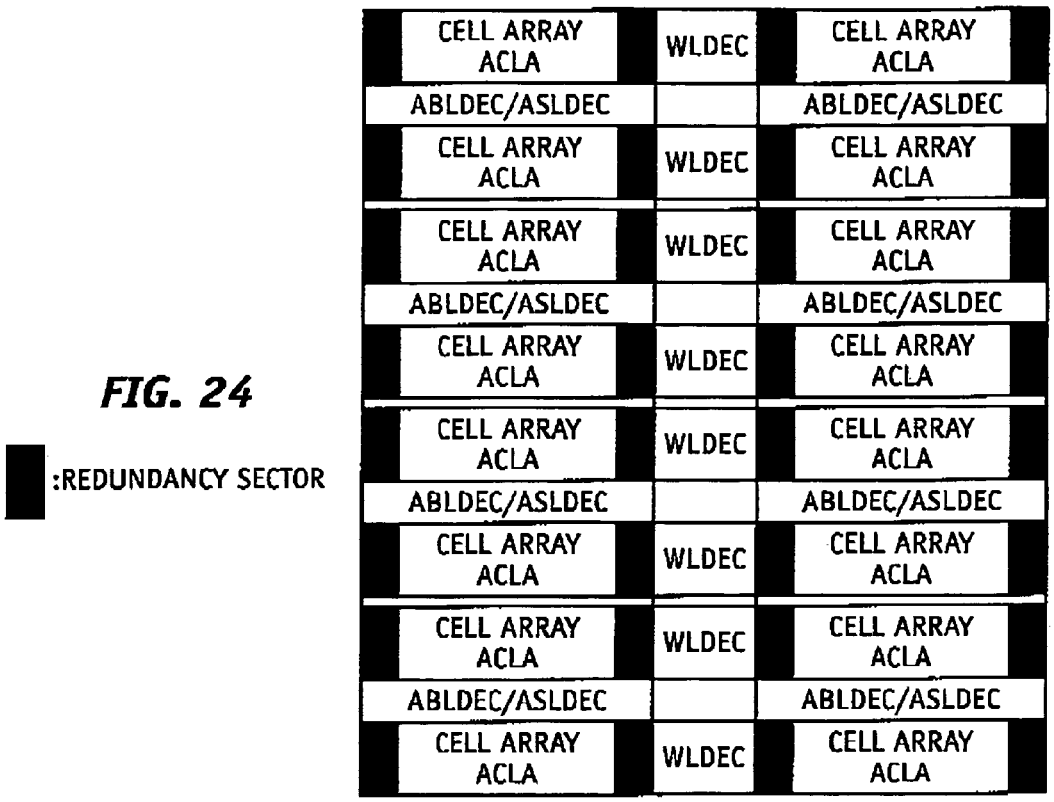
FIG. 24 is a conceptual diagram showing a redundancy sector constitution in accordance with Patent Document 2.
Figure 25:
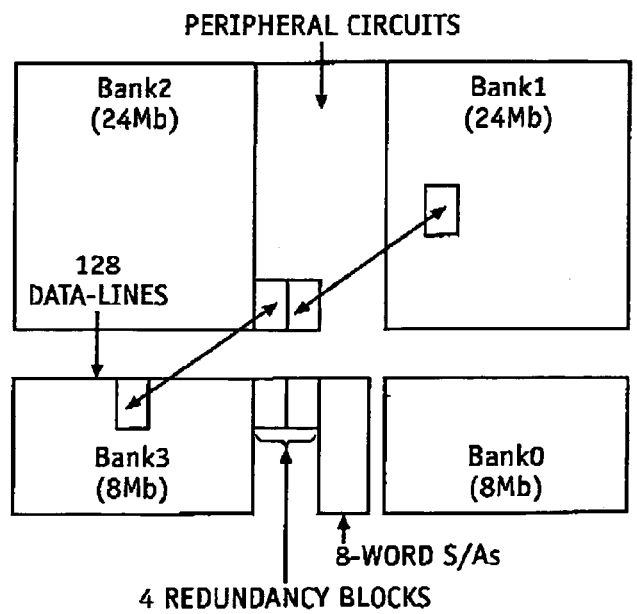
FIG. 25 is a conceptual diagram showing a redundancy sector constitution in accordance with the IEEE Document.

FIG. 22 shows a specific example of the bias circuit C. It is a circuit biasing a well region having a redundant memory block during the erase operation. Instead of the output signal of the AND circuit in the bias circuits A (FIG. 20), the redundancy signal RED is directly inputted to the NAND logic gate.

The output signal of the NAND logic gate is at a high level irrespective of the logic level of the erase signal Erase in the case where redundancy processing is not conducted (RED=Lo) to maintain the PMOS transistor in the non-conductive state. The setting of the erase operation (Erase=Hi) is performed in the case where redundancy processing is conducted (RED=Hi). The output signal of the NAND logic gate is at a low level to conduct the PMOS transistor. The P/N well region can be biased by the high voltage level bias voltage VH as well bias at erase.

As described above in detail, according to the semiconductor memory device and the redundancy remedy method for the semiconductor memory device according to this embodiment, the yield is enhanced with optimization of the manufacturing and circuits through improvement in the manufacturing process and circuit function of the semiconductor memory device. Redundant memory blocks necessary for defectiveness remedy of the semiconductor memory device can be provided. Redundancy remedy efficiency can be improved while minimizing increased chip die size of the semiconductor memory device.

According to the first embodiment (FIG. 2), redundant memory blocks are distributively arranged at the ends of the memory block columns (m=0 to 3). The redundant memory blocks are not added to the ends of the memory block columns (m=0 to 3). An inefficient layout such as wiring bypass with such protrusive arrangements can be avoided. The unevenness at the peripheral edge of a memory region in which memory blocks are developed is reduced to realize a layout having good connection efficiency.

According to the second embodiment (FIG. 10), redundant memory blocks are arranged on region(s) free from memory block(s). In the case where memory blocks with head address are arranged as a specific memory block in the highest end position of the small sector instead of an inherent arrangement position as a boot sector storing a boot program, the region(s) free from memory block(s) is/are open region(s) of memory block(s) left on the inherent arrangement position. The open region(s) can be effectively used. The open region(s) exists/exist in one corner of memory block arranged and developed in a matrix. Global bit lines and global word lines can be both shared with peripheral memory blocks. No exclusive wiring and control circuits are necessary. No exclusive arrangement regions need be secured for redundant memory blocks and the occupied area on a chip die due to the redundant memory block arrangement is not increased.

According to the second and third embodiments (FIGS. 10 and 14), a redundant memory block does not exist by memory block column (m=0 to 3) and is localized in a predetermined memory block column. A global bit line used in the memory block column is shared. An exclusive global bit line for the redundant memory block need not be formed and no exclusive control circuits such as an exclusive column decoder and precharge circuit are necessary. A minimum number of redundant memory blocks is therefore required minimizing the occupied area on a chip die with the redundant memory block arrangement.

According to the first and fourth embodiments (FIGS. 2 and 15), when four memory block columns (m=0 to 3) are the to-be-remedied unit, redundancy memory sub-blocks in which a memory block is divided into four in the row direction can be arranged by a memory block column (FIG. 5) and redundancy memory sub-blocks divided into two can be arranged (FIG. 15).

When non-volatile memory cells are provided as memory cells and redundancy memory sub-blocks dividedly arranged at the ends of memory block columns share a global bit line of the memory block column (FIG. 2), voltage bias must be applied to the well region in which a redundant memory block is arranged to perform access operation such as batch erase by unit of redundant memory block. In the first well division example (FIG. 19), the well region in which a redundant memory block and a memory block are arranged is shared so that bias application can be conducted by the bias circuit B. In the second well division example (FIG. 21), the well region of a redundant memory block is electrically separated from the well region of a memory block and the well region of the redundant memory block can be singly biased.

Bias application can be conducted to a minimum number of well regions necessary for the access operation such as batch erase, thereby reducing time delay and electric current consumption for the bias application.

The object of the present invention which has been made in view of the above-described problem is to provide a semiconductor memory device comprising: bit lines; word lines intersected to the bit lines; and memory cells connected to the bit lines and the word lines, the memory cells being arranged in a matrix to form a memory block, a plurality of which are arranged in bit line wiring directions sharing respective bit lines to form a memory block column arranged in word line wiring directions, wherein at least two of the memory block columns adjoining each other constitute a to-be-remedied unit, and redundant memory block(s), which is/are arranged sharing bit lines with the memory block column(s), for applying redundancy thereto which is/are provided in each to-be-remedied unit and number of redundant memory block(s) is/are smaller than that of memory block column(s) belonging to the to-be-remedied unit.

In the semiconductor memory device, for applying redundancy, the number of redundant memory block(s) is smaller than that of memory block column(s) constituting a to-be-remedied unit. The redundant memory blocks are arranged sharing bit line with the memory block columns.

Also, the semiconductor memory device of the present invention is characterized in that redundant memory block (s) is/are arranged with block(s) divided into redundant memory sub-blocks by the memory block column belonging to the to-be-remedied unit, and each to-be-remedied memory sub-block has memory capacity equivalent to memory capacity of the memory block divided by a factor (1 is excluded) for factorization of the number of memory block columns belonging to the to-be-remedied unit. Furthermore, the redundant memory sub-blocks are arranged at an end of memory block column(s) in bit line wiring direction.

Also, redundant memory sub-blocks are characterized in that they can be arranged at either one of the ends of the memory block columns in a bit line wiring direction. The redundancy memory sub-blocks are closely arranged by unit in accordance with the memory capacity of the memory block. Thus, bias applications such as batch erase when memory cells are non-volatile memory cells can be easily conducted.

The redundant memory sub-blocks are characterized in that they are arranged in a first well region at least by unit in accordance with the memory capacity of the memory block. The redundant memory sub-blocks are arranged in the identical first well region by the unit of memory capacity of redundancy. Bias application to the well region can be conducted in accordance with the unit of redundancy.

The first well region is electrically connected with at least one second well region in which at least one memory block is arranged. Bias application to the first well region in which redundancy memory sub-blocks are arranged can be conducted by a bias circuit for the second well region in which a memory block is arranged. No exclusive bias circuits need be provided. The first well region and the second well region(s) are electrically connected and are constructed by identical well region. Also, the first well region is formed electrically separated from the second well region(s) in which memory block(s) is/are arranged.

The semiconductor memory device of the present invention is characterized in that redundant memory block(s) is/are arranged on region(s) free from memory block(s) existing in the to-be-remedied unit. In case access information to a predetermined memory block is replaced with information to indicate a specific memory block to be arranged on a specific arrangement position instead of an essential arrangement position, region(s) free from memory block(s) is/are open region(s) of memory block(s) left on the essential arrangement position. The open region(s) left in accordance with the memory block arrangement specifications in the semiconductor memory device can be effectively used. The open region(s) exists/exist in one corner of memory block arranged and developed in bit line and word line wiring directions. Bit lines and word lines can be both shared with peripheral memory blocks. No exclusive wiring and control circuits are necessary. No exclusive arrangement regions need be secured for redundant memory blocks. The occupied area on a chip die due to the redundant memory block arrangement is not increased.

The specific memory block is a boot block in which system start information is stored in a non-volatile memory device. The specific arrangement region may be arranged in the head position in a predetermined memory region such as a bank.

In the redundancy remedy method for the semiconductor memory device according to the present invention which has been made to achieve the object, wherein redundant memory block(s) is/are arranged with block(s) divided into redundant memory sub-blocks by the memory block column belonging to the to-be-remedied unit, and each to-be-remedied memory sub-block has memory capacity equivalent to memory capacity of the memory block divided by a factor (1 is excluded) for factorization of the number of memory block columns belonging to the to-be-remedied unit, the redundancy remedy method includes the steps of: redundancy judge step for judging whether the memory block including a memory cell indicated by an inputted address is a defective memory block or not and, if there are plural defective memory blocks, judging identifiers of the defective memory blocks; and redundancy replace step for assigning a redundant memory sub-block to a judged defective memory block depending on an address for identifying a memory cell in for each memory capacity of the factors for factorization and if necessary, depending on the identifier.

In the redundancy remedy method for the semiconductor memory device, when assigning, to a redundancy memory sub-block, a defective memory block divided by a factor for factorization of the number of memory block columns, an address for identifying a memory cell in a memory block can be used. If there are plural defective memory blocks, a redundancy memory sub-block assigned using an identifier for identifying each of them is determined.

The address is a row address for identifying a word line in a memory block. A defective memory block divided by a unit of predetermined row address can be assigned to a redundancy memory sub-block. The width in word line wiring direction of a redundancy memory sub-block can be the same as that of a memory block.

The address and the identifier may be recognized as column address for identifying memory block column on which redundant memory sub-block(s) is/are arranged.

This embodiment is described by taking up as an example the semiconductor memory device having a layout constitution mixing the large banks and the small banks. The present invention is not limited to this. The number of arranged memory cells in a memory block is not limited to this embodiment. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

For example, in the described embodiment, redundancy memory sub-blocks are dividedly arranged in memory blocks to the large banks (FIG. 2) and redundant memory blocks are arranged on region(s) free from memory block(s) in the small banks (FIG. 10). The former arrangement can be provided in the small banks. The latter arrangement can be provided in the large banks if there is/are open region(s).

These arrangement constitutions can be arbitrarily combined including the case of arranging redundant memory blocks in the region between the large banks and the small banks (FIG. 14).

INDUSTRIAL APPLICABILITY

As is apparent from the above description, according to the present invention, it is possible to provide a semiconductor memory device and a redundancy remedy method for the semiconductor memory device which can provide redundant memory block arrangement enabling efficient redundancy remedy while reducing increased chip die area and can conduct efficient bias application to redundant memory blocks.

What is claimed is:

1. A semiconductor memory device comprising:
   bit lines;
   word lines intersecting the bit lines;
   memory cells connected to the bit lines and the word lines, the memory cells being arranged in a matrix to form a plurality of memory blocks, wherein the plurality of memory blocks are arranged in a bit line wiring direction sharing respective bit lines to form a memory block column arranged in a word line wiring direction, wherein at least two of the memory block columns adjoining each other constitute a to-be-remedied unit; and
   redundant memory block(s), which is/are arranged to share bit lines with the memory block column(s), which is/are provided in each to-be-remedied unit for applying redundancy thereto, wherein the number of redundant memory block(s) is/are smaller than the number of memory block column(s) belonging to the to-be-remedied unit.

2. A semiconductor memory device according to claim 1, wherein the redundant memory block(s) is/are arranged with block(s) divided into redundant memory sub-blocks by the memory block column belonging to the to-be-remedied unit, and
   each to-be-remedied memory sub-block has memory capacity equivalent to a memory capacity of the memory block divided by an integer factor (1 is excluded) for factorization of the number of the memory block columns belonging to the to-be-remedied unit.

3. A semiconductor memory device according to claim 2, wherein the redundant memory sub-blocks are arranged at an end of memory block column(s) in the bit line wiring direction.

4. A semiconductor memory device according to claim 3, wherein the redundant memory sub-blocks are arranged at either end of the memory block columns in the bit line wiring direction by a unit of the memory capacity of the memory block.

5. A semiconductor memory device according to claim 2, wherein the redundant memory sub-blocks are arranged in a first well region at least by a unit of the memory capacity of the memory block.

6. A semiconductor memory device according to claim 5, wherein the first well region is electrically connected with at least one second well region in which at least one memory block is arranged.

7. A semiconductor memory device according to claim 6, wherein the first well region and the second well region(s) electrically connected thereto are constituted by an identical well region.

8. A semiconductor memory device according to claim 5, wherein the first well region is formed electrically separate from the second well region(s) in which memory block(s) is/are arranged.

9. A semiconductor memory device according to claim 3, wherein the redundant memory sub-blocks are arranged in the first well region at least by a unit of the memory capacity of the memory block.

10. A semiconductor memory device according to claim 9, wherein the first well region is electrically connected with at least one second well region in which at least one memory block is arranged.

11. A semiconductor memory device according to claim 10, wherein the first well region and the second well region(s) electrically connected thereto are constituted by an identical well region.

12. A semiconductor memory device according to claim 9, wherein the first well region is formed electrically separate from the second well region(s) in which memory block(s) is/are arranged.

13. A semiconductor memory device according to claim 1, wherein redundant memory block(s) is/are arranged on region(s) free from memory block(s) existing in the to-be-remedied unit.

14. A semiconductor memory device according to claim 13, wherein when access information to a predetermined memory block is replaced with information to indicate a specific memory block to be arranged in a specific arrangement position instead of in an essential arrangement position, region(s) free from memory block(s) is/are open region (s) of memory block(s) left in the essential arrangement position based on the access information.

* * * * *